(12) United States Patent
Rathburn (10) Patent No.: US 8,525,346 B2
(45) Date of Patent: Sep. 3, 2013

(54) COMPLIANT CONDUCTIVE NANO-PARTICLE ELECTRICAL INTERCONNECT

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 0 days.

(21) Appl. No.: 13/448,914

(22) Filed: Apr. 17, 2012

(65) Prior Publication Data

US 2012/0202364 A1 Aug. 9, 2012

Related U.S. Application Data

(63) Continuation-in-part of application No. 13/266,573, filed as application No. PCT/US2010/036363 on May 27, 2010, application No. 13/448,914, which is a continuation-in-part of application No. 13/318,382, filed as application No. PCT/US2010/036313 on May 27, 2010, application No. 13/448,914, which is a continuation-in-part of application No. PCT/US2010/040197, filed on Jun. 28, 2010.

(60) Provisional application No. 61/476,500, filed on Apr. 18, 2011, provisional application No. 61/183,411, filed on Jun. 2, 2009, provisional application No. 61/183,335, filed on Jun. 2, 2009, provisional application No. 61/221,380, filed on Jun. 29, 2009.

(51) Int. Cl.
*H01L 23/48* (2006.01)

(52) U.S. Cl.
USPC ........... 257/774; 257/734; 257/737; 257/738; 257/773; 257/E23.01; 257/E23.145; 257/E23.174; 438/106; 438/121; 438/637; 174/254; 174/261; 439/278

(58) Field of Classification Search
USPC ........... 257/734, 737, 738, 773, 774, E21.09, 257/E21.499, E21.506, E21.577, E21.599, 257/E23.01, E23.023, E23.068, E23.069, 257/E23.145, E23.174; 438/106–108, 113, 438/121, 478, 622, 637; 361/765; 29/25, 29/41, 593, 600, 620, 825, 829, 832, 841, 29/846, 874, 884; 174/254, 540.52, 68.1, 174/260, 261, 264–267, 359; 324/754.03, 324/755.01, 762.03; 439/83, 628, 700, 43–50, 439/271, 278

See application file for complete search history.

(56) References Cited

U.S. PATENT DOCUMENTS

| | | | |
|---|---|---|---|
| 3,672,986 A | * | 6/1972 | Schneble, Jr. et al. ........ 428/139 |
| 4,188,438 A | | 2/1980 | Burns |

(Continued)

FOREIGN PATENT DOCUMENTS

| | | |
|---|---|---|
| JP | 2003/217774 | 7/2003 |
| WO | WO 91/14015 | 9/1991 |

(Continued)

OTHER PUBLICATIONS

Liu et al., "All-polymer capacitor fabricated with inkjet printing technique", Solid-State Electronics, vol. 47, pp. 1543-1548 (2003).*

(Continued)

*Primary Examiner* — Bac Au
*Assistant Examiner* — Victor Barzykin
(74) *Attorney, Agent, or Firm* — Stoel Rives LLP (57) ABSTRACT

An electrical interconnect providing an interconnect between contacts on an IC device and contact pads on a printed circuit board (PCB). The electrical interconnect includes a substrate with a plurality of through holes extending from a first surface to a second surface. A resilient material is located in the through holes. The resilient material includes an opening extending from the first surface to the second surface. A plurality of discrete, free-flowing conductive nano-particles are located in the openings of the resilient material. The conductive particles are substantially free of non-conductive materials. A plurality of first contact members are located in the through holes adjacent the first surface and a plurality of second contact members are located in the through holes adjacent the second surface. The first and second contact members are electrically coupled to the nano-particles.

21 Claims, 5 Drawing Sheets

(56) References Cited

U.S. PATENT DOCUMENTS

| | | | |
|---|---|---|---|
| 4,489,999 A | 12/1984 | Miniet | |
| 4,922,376 A | 5/1990 | Pommer et al. | |
| 4,964,948 A * | 10/1990 | Reed | 216/18 |
| 5,014,159 A | 5/1991 | Butt | |
| 5,161,983 A | 11/1992 | Ohno | |
| 5,286,680 A | 2/1994 | Cain | |
| 5,378,981 A | 1/1995 | Higgins, III | |
| 5,454,161 A | 10/1995 | Beilin et al. | |
| 5,479,319 A | 12/1995 | Werther et al. | |
| 5,509,019 A | 4/1996 | Yamamura | |
| 5,562,462 A | 10/1996 | Matsuba et al. | |
| 5,659,181 A | 8/1997 | Bridenbaugh | |
| 5,716,663 A | 2/1998 | Capote et al. | |
| 5,741,624 A | 4/1998 | Jeng et al. | |
| 5,761,801 A | 6/1998 | Gebhardt et al. | |
| 5,791,911 A | 8/1998 | Fasano et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,933,558 A | 8/1999 | Sauvageau et al. | |
| 6,080,932 A | 6/2000 | Smith et al. | |
| 6,118,426 A | 9/2000 | Albert | |
| 6,120,588 A | 9/2000 | Jacobson | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 * | 3/2001 | Iino et al. | 428/209 |
| 6,247,938 B1 | 6/2001 | Rathburn | |
| 6,252,564 B1 | 6/2001 | Albert | |
| 6,270,363 B1 * | 8/2001 | Brofman et al. | 439/91 |
| 6,312,971 B1 | 11/2001 | Amundson | |
| 6,313,528 B1 | 11/2001 | Solberg | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 * | 6/2003 | Brindle et al. | 361/769 |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,744,126 B1 | 6/2004 | Chiang | |
| 6,750,473 B2 | 6/2004 | Amundson | |
| 6,750,551 B1 | 6/2004 | Frutschy et al. | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,967,640 B2 | 11/2005 | Albert | |
| 6,971,902 B2 | 12/2005 | Taylor | |
| 7,045,015 B2 | 5/2006 | Renn | |
| 7,101,210 B2 | 9/2006 | Lin | |
| 7,114,960 B2 | 10/2006 | Rathburn | |
| 7,121,839 B2 | 10/2006 | Rathburn | |
| 7,148,128 B2 | 12/2006 | Jacobson | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,382,363 B2 | 6/2008 | Albert et al. | |
| 7,410,825 B2 | 8/2008 | Majumdar et al. | |
| 7,411,304 B2 * | 8/2008 | Kirby et al. | 257/773 |
| 7,417,299 B2 | 8/2008 | Hu | |
| 7,417,314 B1 * | 8/2008 | Lin et al. | 257/737 |
| 7,422,439 B2 | 9/2008 | Rathburn et al. | |
| 7,423,219 B2 | 9/2008 | Kawaguchi et al. | |
| 7,458,150 B2 * | 12/2008 | Totokawa et al. | 29/852 |
| 7,485,345 B2 | 2/2009 | Renn | |
| 7,508,076 B2 | 3/2009 | Japp et al. | |
| 7,537,461 B2 | 5/2009 | Rathburn | |
| 7,538,415 B1 | 5/2009 | Lin et al. | |
| 7,548,430 B1 | 6/2009 | Huemoeller et al. | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 * | 6/2010 | Bumb et al. | 439/91 |
| 7,800,916 B2 | 9/2010 | Blackwell et al. | |
| 7,833,832 B2 * | 11/2010 | Wood et al. | 438/109 |
| 7,898,087 B2 * | 3/2011 | Chainer | 257/775 |
| 8,148,643 B2 * | 4/2012 | Hirose et al. | 174/255 |
| 8,158,503 B2 * | 4/2012 | Abe | 438/597 |
| 8,232,632 B2 * | 7/2012 | Rathburn | 257/692 |
| 8,344,516 B2 * | 1/2013 | Chainer | 257/774 |
| 2001/0012707 A1 | 8/2001 | Ho et al. | |
| 2001/0016551 A1 | 8/2001 | Yishio et al. | |
| 2002/0011639 A1 | 1/2002 | Carlson et al. | |
| 2002/0062200 A1 | 5/2002 | Mori et al. | |
| 2002/0079912 A1 | 6/2002 | Shahriari et al. | |
| 2002/0088116 A1 | 7/2002 | Milkovich et al. | |
| 2002/0098740 A1 | 7/2002 | Ooya | |
| 2002/0105080 A1 | 8/2002 | Speakman | |
| 2002/0105087 A1 | 8/2002 | Forbes et al. | |
| 2002/0160103 A1 | 10/2002 | Fukunaga et al. | |
| 2003/0003779 A1 | 1/2003 | Rathburn | |
| 2003/0114029 A1 | 6/2003 | Lee et al. | |
| 2003/0117161 A1 | 6/2003 | Burns | |
| 2003/0156400 A1 | 8/2003 | Dibene et al. | |
| 2003/0162418 A1 | 8/2003 | Yamada | |
| 2003/0188890 A1 | 10/2003 | Bhatt et al. | |
| 2004/0029411 A1 | 2/2004 | Rathburn | |
| 2004/0048523 A1 | 3/2004 | Huang et al. | |
| 2004/0054031 A1 | 3/2004 | Jacobson | |
| 2004/0070042 A1 | 4/2004 | Lee et al. | |
| 2004/0077190 A1 | 4/2004 | Huang et al. | |
| 2004/0174180 A1 | 9/2004 | Fukushima et al. | |
| 2004/0183557 A1 | 9/2004 | Akram | |
| 2004/0184219 A1 | 9/2004 | Otsuka et al. | |
| 2004/0217473 A1 | 11/2004 | Shen | |
| 2004/0243348 A1 | 12/2004 | Minatani | |
| 2005/0048680 A1 | 3/2005 | Matsumani | |
| 2005/0101164 A1 | 5/2005 | Rathburn | |
| 2006/0012966 A1 | 1/2006 | Chakravorty | |
| 2006/0024924 A1 | 2/2006 | Haji et al. | |
| 2006/0044357 A1 | 3/2006 | Andersen | |
| 2006/0087064 A1 | 4/2006 | Daniel et al. | |
| 2006/0157103 A1 | 7/2006 | Sheats et al. | |
| 2006/0160379 A1 | 7/2006 | Rathburn | |
| 2006/0208230 A1 | 9/2006 | Cho et al. | |
| 2006/0258912 A1 | 11/2006 | Belson et al. | |
| 2006/0261827 A1 | 11/2006 | Cooper et al. | |
| 2007/0145981 A1 | 6/2007 | Tomita et al. | |
| 2007/0148822 A1 | 6/2007 | Haba et al. | |
| 2007/0221404 A1 * | 9/2007 | Das et al. | 174/264 |
| 2007/0232059 A1 * | 10/2007 | Abe | 438/625 |
| 2007/0269999 A1 | 11/2007 | Di Stefano | |
| 2007/0273394 A1 | 11/2007 | Tanner et al. | |
| 2007/0296090 A1 | 12/2007 | Hembree | |
| 2008/0008822 A1 | 1/2008 | Kowalski | |
| 2008/0073110 A1 | 3/2008 | Shioga et al. | |
| 2008/0093115 A1 | 4/2008 | Lee | |
| 2008/0143358 A1 | 6/2008 | Breinlinger | |
| 2008/0143367 A1 | 6/2008 | Chavineau-Lovgren | |
| 2008/0156856 A1 | 7/2008 | Laurx | |

| | | | |
|---|---|---|---|
| 2008/0157361 | A1* | 7/2008 | Wood et al. ............... 257/738 |
| 2008/0182436 | A1 | 7/2008 | Rathburn |
| 2008/0220584 | A1 | 9/2008 | Kim et al. |
| 2008/0246136 | A1 | 10/2008 | Haba et al. |
| 2008/0250363 | A1 | 10/2008 | Goto et al. |
| 2008/0265919 | A1 | 10/2008 | Izadian |
| 2008/0290885 | A1 | 11/2008 | Matsunami |
| 2009/0058444 | A1 | 3/2009 | McIntyre |
| 2009/0061089 | A1 | 3/2009 | King |
| 2009/0065918 | A1 | 3/2009 | Murphy |
| 2009/0127698 | A1* | 5/2009 | Rathburn ............. 257/698 |
| 2009/0224404 | A1* | 9/2009 | Wood et al. ............ 257/738 |
| 2010/0022105 | A1 | 1/2010 | Di Stefano |
| 2011/0101540 | A1* | 5/2011 | Chainer ............. 257/774 |
| 2012/0017437 | A1* | 1/2012 | Das et al. ............. 29/852 |
| 2012/0043119 | A1 | 2/2012 | Rathburn |
| 2012/0043130 | A1 | 2/2012 | Rathburn |
| 2012/0043667 | A1 | 2/2012 | Rathburn |
| 2012/0044659 | A1 | 2/2012 | Rathburn |
| 2012/0049342 | A1 | 3/2012 | Rathburn |
| 2012/0049877 | A1 | 3/2012 | Rathburn |
| 2012/0051016 | A1 | 3/2012 | Rathburn |
| 2012/0055701 | A1 | 3/2012 | Rathburn |
| 2012/0055702 | A1 | 3/2012 | Rathburn |
| 2012/0056332 | A1 | 3/2012 | Rathburn |
| 2012/0056640 | A1 | 3/2012 | Rathburn |
| 2012/0058653 | A1 | 3/2012 | Rathburn |
| 2012/0061846 | A1 | 3/2012 | Rathburn |
| 2012/0061851 | A1 | 3/2012 | Rathburn |
| 2012/0062270 | A1 | 3/2012 | Rathburn |
| 2012/0068727 | A1 | 3/2012 | Rathburn |
| 2012/0161317 | A1 | 6/2012 | Rathburn |
| 2012/0164888 | A1 | 6/2012 | Rathburn |
| 2012/0168948 | A1 | 7/2012 | Rathburn |
| 2012/0171907 | A1 | 7/2012 | Rathburn |
| 2012/0182035 | A1 | 7/2012 | Rathburn |
| 2012/0199985 | A1 | 8/2012 | Rathburn |
| 2012/0244728 | A1 | 9/2012 | Rathburn |
| 2012/0252164 | A1* | 10/2012 | Nakao et al. ............ 438/107 |
| 2012/0257343 | A1* | 10/2012 | Das et al. ............. 361/679.4 |
| 2012/0268155 | A1 | 10/2012 | Rathburn |
| 2013/0078860 | A1 | 3/2013 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO-2012/061008 | 5/2012 |
| WO | WO-2012/074963 | 6/2012 |
| WO | WO-2012/074969 | 6/2012 |
| WO | WO-2012/078493 | 6/2012 |
| WO | WO 2012/122142 | 9/2012 |
| WO | WO 2012/125331 | 9/2012 |
| WO | WO 2013/036565 | 3/2013 |

OTHER PUBLICATIONS

Notification of Transmittal of the International Search Report and the Written Opinion of the International Searching Authority mailed Jul. 30, 2010 in International Application No. PCT/US2010/036043.

Notification of Transmittal of the International Search Report and the Written Opinion of the International Searching Authority mailed Jul. 21, 2010 in International Application No. PCT/US2010/036047.

Notification of Transmittal of the International Search Report and the Written Opinion of the International Searching Authority mailed Jul. 28, 2010 in International Application No. PCT/US2010/036363.

Notification of Transmittal of the International Search Report and the Written Opinion of the International Searching Authority mailed Jul. 28, 2010 in International Application No. PCT/US2010/036377.

Notification of Transmittal of the International Search Report and the Written Opinion of the International Searching Authority mailed Jul. 30, 2010 in International Application No. PCT/US2010/036388.

Notification of Transmittal of the International Search Report and the Written Opinion of the International Searching Authority mailed Jul. 27, 2010 in International Application No. PCT/US2010/036397.

Notification of Transmittal of the International Search Report and the Written Opinion of the International Searching Authority mailed Jul. 30, 2010 in International Application No. PCT/US2010/036055.

Notification of Transmittal of the International Search Report and the Written Opinion of the International Searching Authority mailed Aug. 4, 2010 in International Application No. PCT/US2010/036288.

Notification of Transmittal of the International Search Report and the Written Opinion of the International Searching Authority mailed Aug. 4, 2010 in International Application No. PCT/US2010/036285.

Notification of Transmittal of the International Search Report and the Written Opinion of the International Searching Authority mailed Jul. 30, 2010 in International Application No. PCT/US2010/036282.

Notification of Transmittal of the International Search Report and the Written Opinion of the International Searching Authority mailed Jul. 30, 2010 in International Application No. PCT/US2010/036295.

Notification of Transmittal of the International Search Report and the Written Opinion of the International Searching Authority mailed Jul. 30, 2010 in International Application No. PCT/US2010/036313.

Notification of Transmittal of the International Search Report and the Written Opinion of the International Searching Authority mailed Aug. 3, 2010 in International Application No. PCT/US2010/037619.

Notification of Transmittal of the International Search Report and the Written Opinion of the International Searching Authority mailed Sep. 7, 2010 in International Application No. PCT/US2010/038600.

Notification of Transmittal of the International Search Report and the Written Opinion of the International Searching Authority mailed Aug. 18, 2010 in International Application No. PCT/US2010/038606.

Notification of Transmittal of the International Search Report and the Written Opinion of the International Searching Authority mailed Sep. 1, 2010 in International Application No. PCT/US2010/040188.

Notification of Transmittal of the International Search Report and the Written Opinion of the International Searching Authority mailed Aug. 20, 2010 in International Application No. PCT/US2010/040197.

Notification of Transmittal of the International Search Report and the Written Opinion of the International Searching Authority mailed Apr. 14, 2011 in International Application No. PCT/US2011/023138.

Notification of Transmittal of the International Search Report and the Written Opinion of the International Searching Authority mailed Aug. 17, 2011 in International Application No. PCT/US2011/033726.

Notification of Transmittal of the International Search Report and the Written Opinion of the International Searching Authority mailed Sep. 27, 2011 in International Application No. PCT/US2011/038845.

Notification of Transmittal of the International Search Report and the Written Opinion of the International Searching Authority mailed Feb. 8, 2012 in International Application No. PCT/US2011/056664.

Notification of Transmittal of the International Search Report and the Written Opinion of the International Searching Authority mailed Mar. 26, 2012 in International Application No. PCT/US2011/062313.

Co-pending U.S. Appl. No. 13/266,486 titled High Performance Surface Mount Electrical Interconnect, filed Oct. 27, 2011.

Co-pending U.S. Appl. No. 13/266,522, titled Compliant Wafer Level Probe Assembly, filed Oct. 27, 2011.

Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,038, titled Compliant Printed Circuit Wafer Probe Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Testet Interface, filed Nov. 7, 2011.
Co-pending U.S. Appl. No. 13/319,228, titled Singulated Semiconductor Device Separable Electrical Interconnect, filed Nov. 7, 2011.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Co-pending U.S. Appl. No. 13/448,865, titled Compliant Core Peripheral Lead Semiconductor Test Socket, filed Apr. 17, 2012.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Co-pending U.S. Appl. No. 13/575,368, titled High Speed Backplane Connector, filed Jul. 26, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.

* cited by examiner

Fig. 6

COMPLIANT CONDUCTIVE NANO-PARTICLE ELECTRICAL INTERCONNECT

RELATED APPLICATIONS

This application claims the benefit of U.S. Provisional Application No. 61/476,500, entitled Compliant Conductive Nano-Particle Electrical Interconnect, filed Apr. 18, 2011, the disclosure of which is hereby incorporated by reference.

This application is a continuation-in-part of U.S. patent application Ser. No. 13/266,573, titled COMPLIANT PRINTED CIRCUIT AREA ARRAY SEMICONDUCTOR DEVICE PACKAGE, filed Oct. 27, 2011, which is a national stage application under 35 U.S.C. §371 of International Application No. PCT/US2010/036363, titled COMPLIANT PRINTED CIRCUIT AREA ARRAY SEMICONDUCTOR DEVICE PACKAGE, filed May 27, 2010, which claims priority to U.S. Provisional Application No. 61/183,411, filed Jun. 2, 2009, all of which are hereby incorporated by reference in their entireties.

This application is a continuation-in-part of U.S. patent application Ser. No. 13/318,382, entitled RESILIENT CONDUCTIVE ELECTRICAL INTERCONNECT, filed Oct. 1, 2011, which is a national stage application under 35 U.S.C. §371 of International Application No. PCT/US2010/036313, titled RESILIENT CONDUCTIVE ELECTRICAL INTERCONNECT, filed May 27, 2010, which claims priority to U.S. Provisional Application No. 61/183,335, filed Jun. 2, 2009, all of which are hereby incorporated by reference in their entireties.

The present application is a continuation-in-part of International Application No. PCT/US2010/040197, titled SINGULATED SEMICONDUCTOR DEVICE SEPARABLE INTERCONNECT, filed Jun. 28, 2010, which claims the benefit of U.S. Provisional Application No. 61/221,380, filed Jun. 29, 2009, which are hereby incorporated by reference in their entireties.

TECHNICAL FIELD

The present disclosure is directed to an electrical interconnect with conductive nano-particles supported by a resilient material.

BACKGROUND OF THE INVENTION

Many types of traditional connectors and sockets are populated with contact members produced by traditional metal stamping techniques. These contacts can be in a flat or "blank" format, or they can be produced with a series of forms, bends, and features to accommodate a desired function such as retention within the plastic housing. Typically, the contact members are designed based upon the needs of the application. In some cases, long life after many actuations is most important, and in some applications cost is far more important than longevity.

These contacts are typically made from a selection of Copper based alloys. Since copper oxidizes the contacts are typically plated with nickel to prevent migration, and a final coating of either a precious metal like gold or a solder-able metal such as tin. In very cost sensitive applications, the contacts are selectively plated only at the interface points where the connection will be made. While conventional contact members have served well over the years, there are some areas that could potentially be improved.

The copper based alloys used for many contacts are a compromise in material properties, where the spring constants are less than stainless steel for example, while the conductivity is less than pure copper or silver. The copper base oxidizes readily, so plating must be applied to at least a portion of the contact to improve the corrosion resistance. Often there are retention features that add electrical parasitic effects, and the demands of pitch reduction often reduce the available area for spring members. The cost of the contact members as a component is often directly related to the material content, the speed at which the contacts are stamped, and the amount and type of plating.

One type of contact method has been used which contains tiny particles of silver molded into a silicone matrix. When compressed, the silver particles touch each other can create electrical contact. Such metalized particle interconnect method suffers from high contact resistance due to the silicone material interfering with the conductive path.

Traditional IC interconnects have reached an electrical performance limit. Next generation IC devices will operate above 5 GHz and beyond and the existing IC interconnects do not provide acceptable performance levels without significant revision.

BRIEF SUMMARY OF THE INVENTION

The present disclosure is directed to an electrical interconnect with conductive nano-particles supported by a resilient material. The present disclosure reduces contact resistance by grouping the conductive particles in a reservoir substantially absent of silicone or binder material within the conductive path to create a superior electrical connection.

The present disclosure is directed to an interconnect assembly that will enable next generation electrical performance. The present interconnect assembly can be located between circuit members or can be formed directly on a circuit member. The present disclosure merges the long-term reliability provided by polymer-based compliance, with the electrical performance of metal conductors. Contact resistance is reduced by grouping the conductive particles in a reservoir substantially absent of silicone or binder material, to create a superior electrical connection.

The present disclosure merges the benefits of metallic conductors with the benefits of a polymer compliant material. The polymer materials are typically dielectric or insulative and can have advantages with regard to plastic deformation, fatigue or other properties. The disclosure utilizes several additive processes to combine the mechanical or structural properties of a polymer material, while adding metal materials in an unconventional fashion to create the electrical path that is refined to provide electrical performance improvements. By adding or arranging metallic particles, conductive inks, plating or portions of traditional alloys the aggregate contact structure can reduce the parasitic effect or impedance mismatch of the contact, potentially increase the current carrying capacity or simplify the assembly process by combining contacts in a group without shorting.

One embodiment is directed to an electrical interconnect providing an interconnect between contacts on an IC device and contact pads on a printed circuit board (PCB). The electrical interconnect includes a substrate with a plurality of through holes extending from a first surface to a second surface. A resilient material is located in the through holes. The resilient material includes an opening extending from the first surface to the second surface. A plurality of discrete, free-flowing conductive nano-particles are located in the openings of the resilient material. The conductive particles are substantially free of non-conductive materials. A plurality of first contact members are located in the through holes adjacent the first surface and a plurality of second contact members are located in the through holes adjacent the second surface.

A dielectric layer is optionally printed on the top surface of the substrate to retain the first contact members to the substrate. The though holes preferably include non-moldable features. The resilient material is optionally formed as an annular structure with a center opening adapted to receive the nano-particles.

The first contact members preferably include raised structures adapted to electrically couple with the contacts on the IC device. The raised structures optionally include a relief area adapted to collect contamination at a location offset from the electrical interface with the contacts on the IC device. At least the first contact members are adapted to move in at least the pitch and roll directions relative to the substrate.

The substrate optionally includes at least one additional circuitry plane. The additional circuitry plane is selected from one of a ground plane, a power plane, an electrical connection to other circuit members, a dielectric layer, or a flexible circuit. At least one electrical device is printed on the substrate and electrically coupled to at least a one of the contact members. The electrical device is selected from one of shielding, near device decoupling, capacitors, transistors, resistors, filters, signal or power altering and enhancing devices, memory devices, embedded IC devices, RF antennae, and the like.

The present disclosure is also directed to an electrical interconnect assembly including a housing that retains the present electrical interconnect. An IC device is located in the housing and electrically coupled with the first contact members. A PCB is soldered to the second contact members.

The present disclosure is also directed to a method of making an electrical interconnect to form an interconnect between contacts on an IC device and contact pads on a printed circuit board (PCB). The method includes the steps of forming a plurality of through holes from a first surface to a second surface of a substrate. A resilient material is imaged in the through holes. The resilient material includes openings extending from the first surface to the second surface. A plurality of discrete, free-flowing conductive nano-particles are deposited in the openings of the resilient material. The conductive particles are preferably substantially free of non-conductive materials. A plurality of first contact members are located in the through holes adjacent the first surface. A plurality of second contact members are located in the through holes adjacent the second surface.

The present disclosure leverages the capabilities of precision additive printed circuit fabrication techniques to create a resilient core structure that is designed to interface to a test board and make temporary electrical contact to the terminal on an IC device. In basic terms, contact points can be created and positioned in the desired location relative to the points of contact to the PCB and the IC device terminals. A series of etching and plating techniques can be employed to create a very precise and short electrical path. The contact members can be supported and biased by resilient materials that can be printed in an appropriate location to provide the desired effect when compressed. The nature of the resilient printed circuit fabrication process allows for many electrical enhancements not possible with traditional socket fabrication and testing techniques.

The disclosed compliant printed circuit fabrication process can allow for very high frequency performance, as well as the addition of on-board electrical devices and circuitry planes that are not available with other test sockets. The production cost for test sockets in accordance with the present disclosure can be a fraction the cost of producing existing test sockets. Use of additive printing processes, such as for example to print electrical features, can reduce capital cost and lead time for building the present test sockets. The additive printing processes can also increase yields over conventional test sockets that rely on conventional lithography tools and masks.

Internal compliance of the entire test socket and of individual contact members on the compliant printed circuit greatly increases performance of the present test sockets. The ability to build multi-layer structures over a relatively large area can permit terminal pitch on the IC devices to be reduced. The addition of circuitry planes and electrical devices in the present test sockets can provide performance enhancements not available with current test sockets. The ability to add electrical devices, such as transistors and memory, to the present test socket can provide the opportunity to incorporate test intelligence, extending the use of legacy test equipment and improving test performance. The present test sockets can provide the opportunity to develop adaptive testing and to alter the IC devices during testing.

The use of additive printing processes can permit the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect can provide advantages in tuning impedance or adding electrical function on a given layer. Tuning performance on a layer by layer basis relative to the previous layer can greatly enhance electrical performance.

The present disclosure merges the long-term performance advantages of traditional PCB and semiconductor packaging with the flexibility of additive printing technology. By combining methods used in the PCB fabrication and semiconductor packaging industries, the present disclosure enables fine line high density circuit structures with attractive cost of manufacture.

The present high performance electrical interconnect can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the interconnect assembly.

The present high performance electrical interconnect can be produced digitally, without tooling or costly artwork. The high performance electrical interconnect can be produced as a "Green" product, with dramatic reductions in environmental issues related to the production of conventional flexible circuits.

The use of additive printing processes permits the material set in a given layer to vary. Traditional PCB and flex circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

DETAILED DESCRIPTION OF THE INVENTION

A high performance electrical interconnect according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high performance electrical interconnects are especially useful for communications, wireless, and memory devices.

The present high performance electrical interconnect can be configured as a low cost, high signal performance interconnect assembly, which has a low profile that is particularly useful for desktop and mobile PC applications. IC devices can be installed and uninstalled without the need to reflow solder. The solder-free electrical connection of the IC devices is environmentally friendly.

Figure 1A:
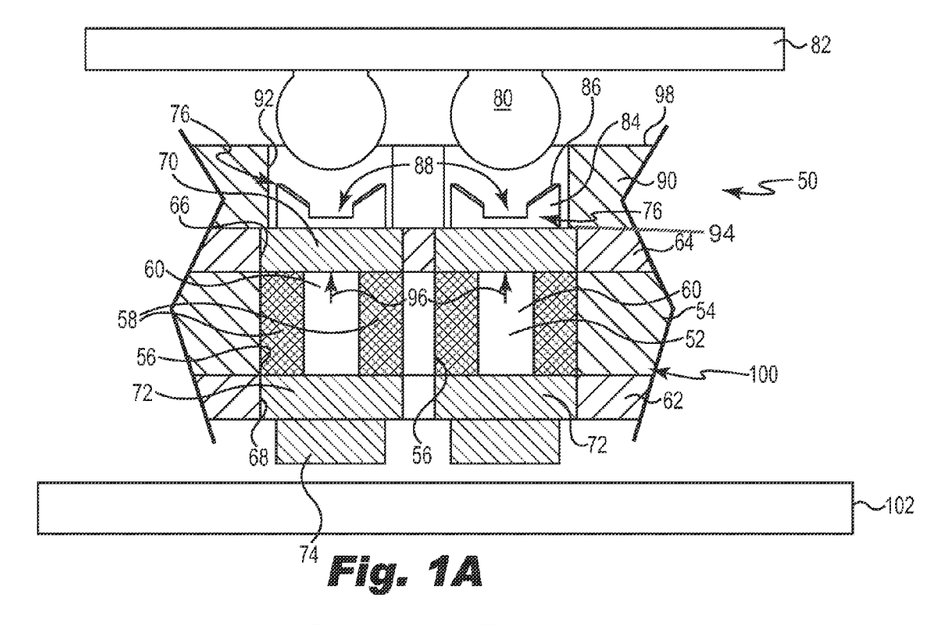
FIG. 1A is a cross-section of an electrical interconnect with conductive particles in accordance with an embodiment of the present disclosure.

FIG. 1A is a side sectional view of an electrical interconnect 50 with conductive nano-particles 52 located between contact members 70, 72 in accordance with an embodiment of the present disclosure. Core layer 54 is drilled, imaged or molded to create a series of openings 56. The openings 56 are filled with photo imaged silicone or urethane to create hollow tubular or annular structures 58 with openings 60. The mass of nano-particles 52 provide a low inductance path with low contact resistance that is an improvement over conductive elastomer based interconnects due to the lack of or minimal silicone or urethane mixed into the conductive path.

Layers 62, 64 are added to the core layer 54 to create recesses 66, 68 that receive contact members 70, 72. Lower contact members 72 are preferably etched from a copper sheet, such as for example, ½ oz copper or copper alloy foil (0.7 mil thick). The sheet is optionally plated, sintered, coined, stamped or sputtered to create the raised features 74. The upper contact members 70 also include raised structures 76 adapted to electrically and mechanically couple with solder balls 80 on IC device 82.

Figure 1B:
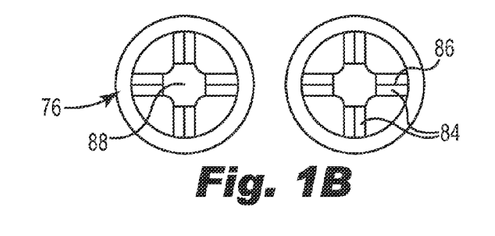
FIG. 1B is a top view of upper contact members of FIG. 1A.

As best illustrated in FIG. 1B, the raised structures 76 includes four blades 84 with angled cutting edges 86 configured to engage with the solder balls 80. The blades 84 can be plated, sputtered or potentially coined to create the interface to the solder balls 80. Many tip shapes are possible depending on the device terminal to be contacted. In one embodiment, the blades 84 are growing out of the base copper and are shown with knife like edges to increase the cutting action with the solder balls 80. The blades can be nickel, or copper plated with nickel, palladium cobalt, rhodium, nickel boron etc. to improve the hardness.

The center regions 88 between the blades 84 includes some relief area under the solder balls 80 to allow for some contamination build-up over time as multiple solder balls leave some material behind. The goal is to provide a self-contained and sealed system so the nano-particles 52 are not exposed to any elements or chemical solution and the entire assembly 50 can be installed, cleaned or replaced at one time without removing individual contact members 70, 72. The electrical interconnect 50 may also be soldered to the target PCB 102 by adding a solder ball or paste.

Layer 90 is added to the layer 62 to create recesses 92 that receive and align the solder balls 80 with the raised structures 76. In the illustrated embodiment, the layer 90 includes shoulders 94 that prevents the contact members 70 from falling out of the recesses 66. The layer 90 can be pre-formed and attached to the layer 62 or deposited using any of the additive techniques discussed herein, such as for example, printing. Upper surface 98 of the layer 90 preferably acts as a travel stop for the IC device 82 to prevent excessive displacement of the contact members 70.

The center regions 60 in the tubular structures 58 are filled with copper or silver nano-particles 52 to create the connection between the upper and lower contact members 70, 72. The silicone or urethane tubular structures 58 provide normal forces 96 that bias the contact members 70 against the shoulders 94. The nano-particles 52 provide some level of independent between the upper and lower contact members 70, 72. The resilient material 58 facilitates displacement of the contact member 70 in the pitch and roll directions relative to the solder balls 80.

The various layers 54, 62, 64, 90 provide a multi-layered substrate 100 can be configured to include additional circuitry planes, such as for example, power planes, ground planes, and the like. The present embodiment leverage a technique which treats the substrate 100 as if it were a printed circuit board. A 3D structure is created that takes advantage of the normal "core" area within a traditional printed circuit board, which is normally not utilized as circuit area and primarily serves as a mechanical support member for the fashioned circuitry. The multi-layered substrate 100 also permits the creation of a variety of internal features, undercuts, or cavities, such as the shoulder 94, that are difficult or typically not possible to make using conventional molding or machining techniques, referred to herein as a "non-moldable feature."

The dielectric layers of the substrate 100 of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 2:
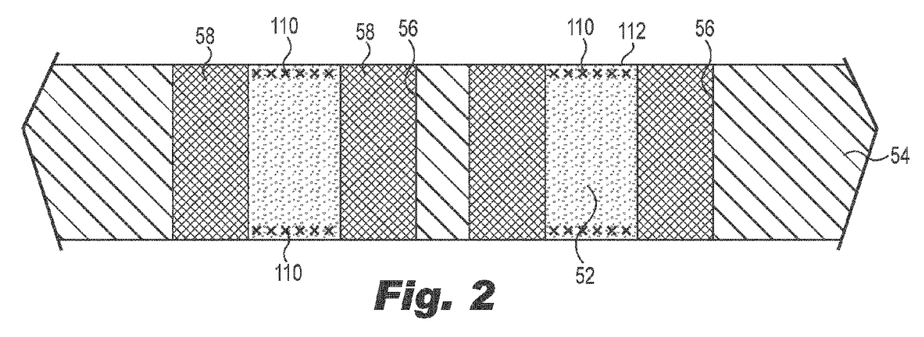
FIG. 2 illustrates a method of making an electrical interconnect in accordance with an embodiment of the present disclosure.

FIG. 2 illustrates a method of making the electrical interconnect 50 of FIG. 1 in accordance with an embodiment of the present disclosure. The goal is to be able to make the electrical interconnect 50 in panel form, without the need to assemble individual contacts. It is contemplated that a plurality of the present electrical interconnects 50 can be formed on a single panel, and subsequently diced into individual electrical interconnects.

The core layer 54 is processed to create the openings 56, such as by drilling, imaging or molding. The openings 56 are filled with photo imaged silicone or urethane to create hollow tubular structures 58 with openings 60. In one embodiment, a silicone or urethane cap 110 to retain the conductive nano-particles 52 in the openings 60. For example, a curable conductive material is printed onto the exposed surface 112 of the nano-particles 52 and subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source. In another embodiment, the nano-particles 52 are sinter slightly to prevent loose particles from escaping. The layers 62, 64 and the contact members 70, 72 are then added as discussed above.

Figure 3:
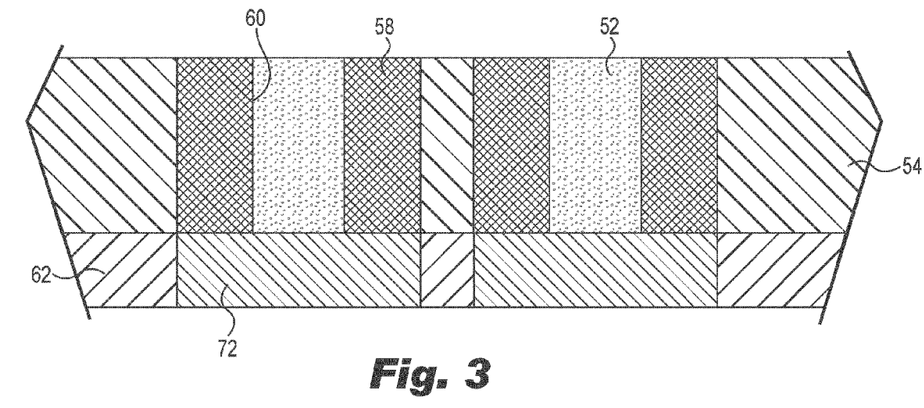
FIG. 3 illustrates an alternate method of making an electrical interconnect in accordance with an embodiment of the present disclosure.

FIG. 3 illustrates an alternate embodiment in which the layer 64 and the contact members 72 are added to the core layer 54. The contact members 72 seal the bottom of the openings 60. The nano-particles 52 are then deposited into the openings 60 followed by application of the layer 62 and the contact members 70 as discussed above.

Figure 4:
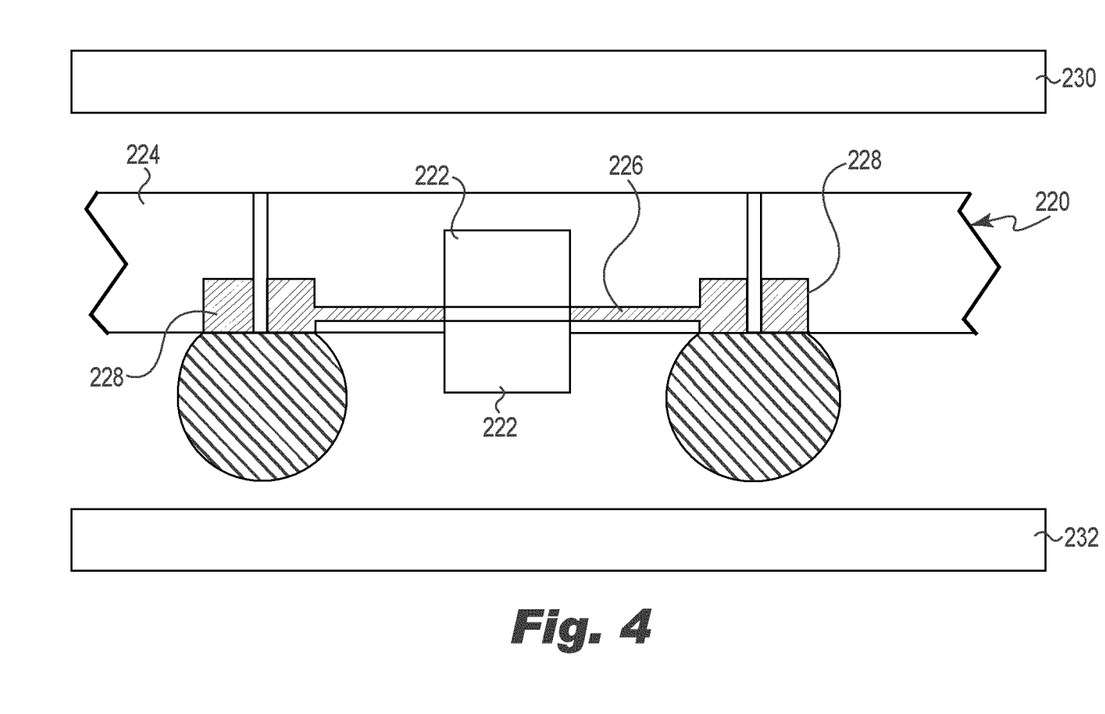
FIG. 4 illustrates an electrical interconnect with on-board electrical devices in accordance with an embodiment of the present disclosure.

FIG. 4 illustrates electrical interconnect 220 with electrical devices 222, such as for example, internal decoupling capacitors, located on substrate 224 in accordance with an embodiment of the present disclosure. Printed conductive traces 226 electrically couple the electrical devices 222 to one or more of the contact pads 228. The electrical devices 222 can be added as discrete components or printed materials, reducing the need for discrete components on the PCB 232 and the integrated circuit device 230. Locating the electrical devices 222 in the semiconductor socket 220 permits integrated circuit manufactures to reduce or eliminate the capacitors currently located on the package 230 and printed circuit board 232. This shift can greatly reduce cost and simplify the package 230 and printed circuit board 232, while improving performance.

The electrical devices 222 can be a power plane, ground plane, capacitor, resistor, filters, signal or power altering and enhancing device, memory device, embedded IC, RF antennae, and the like. The electrical devices 222 can be located on either surface of the substrate 224, or embedded therein. The electrical devices 222 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

Locating such electrical devices 222 on the electrical interconnect 220 improves performance and enables a reduction in the cost of integrated circuit devices and the PCB 232. Integrated circuit manufactures are limited by the pitch that the PCB 232 can accommodate and still keep the printed circuit board to four layers. The integrated circuit makers can manufacture the integrated circuit device 230 with a smaller pitch, but with the pin counts is so high that the printed circuit board 232 likely requires additional layers in order to route all of the signals. The present electrical interconnect 220 also permits integrated circuit manufactures to reduce the pitch of the contacts on the IC device 230, and perform any required signal routing in the electrical interconnect 220, rather than in the printed circuit board 232 or by adding daughter boards to the system.

The high performance electrical interconnect 220 with printed electrical devices 222. The electrical devices 222 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 222 include printed LED indicator and display electronics. Geometries can also be printed to provide capacitive coupling. Compliant material can be added between circuit geometry, such as discussed above, so the present electrical interconnect can be plugged into a receptacle or socket, supplementing or replacing the need for compliance within the connector.

The electrical devices 222 are preferably printed during construction of the interconnect assembly 220. The electrical devices 222 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 222 can be formed using printing technology, adding intelligence to the high performance electrical interconnect 220. Features that are typically located on other circuit members can be incorporated into the interconnect 220 in accordance with an embodiment of the present disclosure.

The availability of printable silicon inks provides the ability to print electrical devices 222, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. Nos. 6,506,438 (Duthaler et al.) and 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electro-optical elements, transistor (including, light emitting, light sensing or solar cell elements, field effect transistor, top gate structures), and the like.

The electrical devices 222 can also be created by aerosol printing, such as disclosed in U.S. Pat. Nos. 7,674,671 (Renn et al.); 7,658,163 (Renn et al.); 7,485,345 (Renn et al.); 7,045, 015 (Renn et al.); and 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate-silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layers are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; and other similar techniques.

Figure 5:
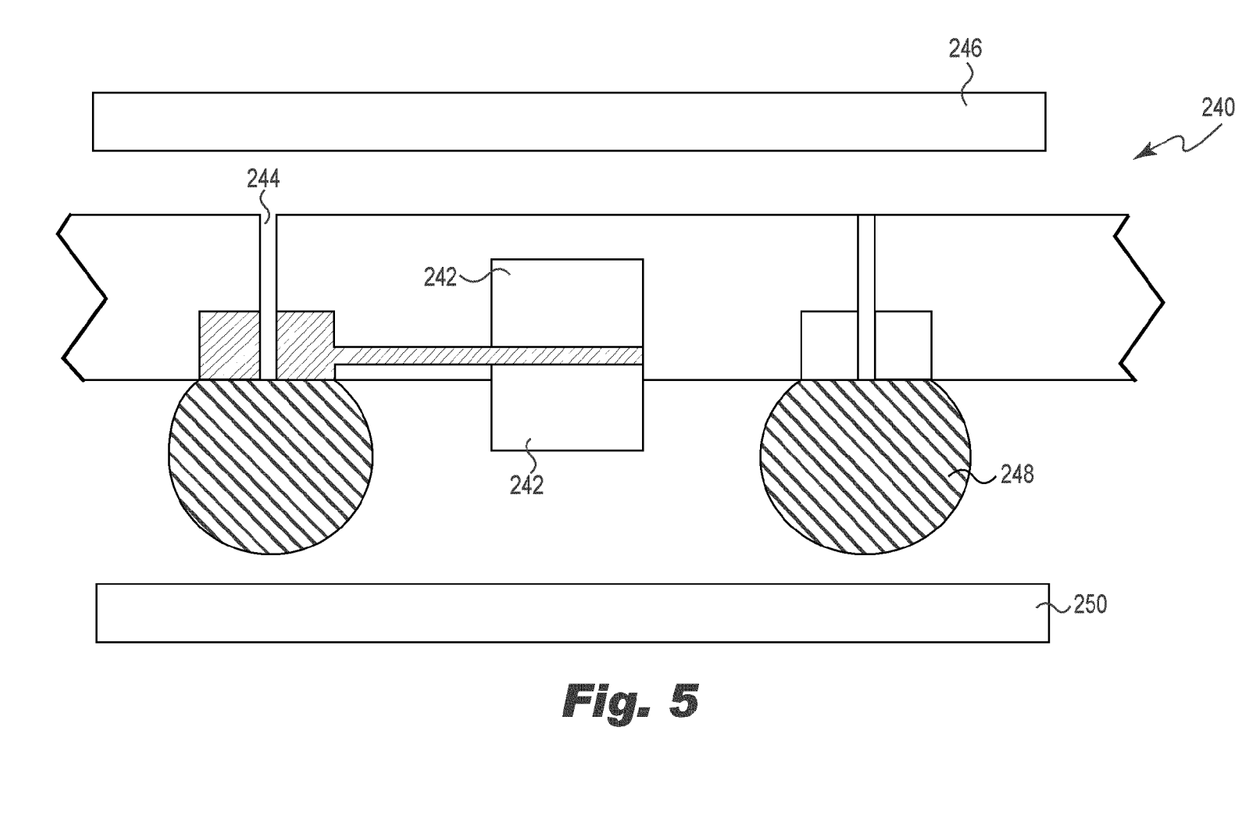
FIG. 5 illustrates an alternate electrical interconnect with on-board electrical devices in accordance with an embodiment of the present disclosure.

FIG. 5 illustrates an alternate electrical interconnect 240 with on-board electrical devices 242 in accordance with an embodiment of the present disclosure. The decoupling capacitance 242 can be a discrete embedded or printed electrical device. Contact member 244 provides the electrical connection to the capacitor located on the semiconductor device 246 and solder ball 248 provides the electrical connection to the capacitor located on printed circuit board 250.

Figure 6:
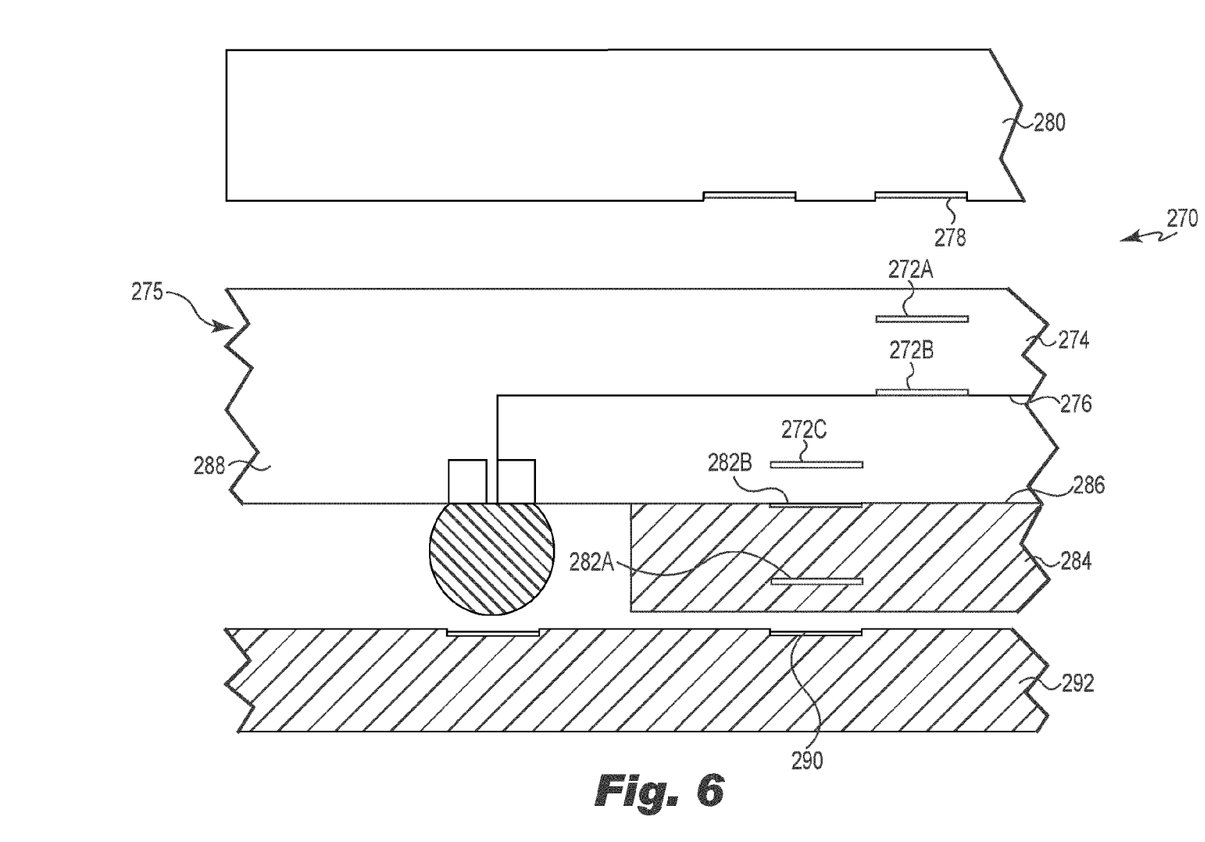
FIG. 6 illustrates an electrical interconnect with capacitive coupling in accordance with an embodiment of the present disclosure.

FIG. 6 is a cross-sectional view of electrical interconnect 270 with various capacitive coupling features in accordance with another embodiment of the present disclosure. A capacitive coupling feature 272A is embedded in layer 274 of the substrate 275. A capacitive coupling feature 272B is located on second surface 276 of the layer 274. The capacitive coupling features 272A, 272B are positioned to electrically couple with contact pad 278 on integrated circuit device 280. The capacitive coupling 272C is embedded in layer 288.

Capacitive coupling feature 282A is embedded in layer 284 of the substrate 275. Capacitive coupling feature 282B is located on first surface 286 of the layer 284. The capacitive coupling feature 282A is positioned to electrically couple with contact pad 290 on the PCB 292. The various capacitive coupling features in the embodiment of FIG. 6 are optionally formed using inkjet printing technology, aerosol printing technology, or other printing technology.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. An electrical interconnect providing an interconnect between contacts on an IC device and contact pads on a printed circuit board (PCB), the electrical interconnect comprising:
    a substrate comprising a plurality of through holes extending from a first surface to a second surface;
    a resilient material located in the through holes, the resilient material including openings extending from the first surface to the second surface;
    a plurality of discrete, free-flowing conductive nano-particles located in the openings of the resilient material, the conductive particles being substantially free of non-conductive materials;
    a plurality of first contact members at least partially located in the through holes adjacent the first surface and electrically coupled with the nano-particles; and
    a plurality of second contact members at least partially located in the through holes adjacent the second surface and electrically coupled with the nano-particles,
    wherein at least the first contact members are configured to pivot in the through holes relative to the substrate while being supported by the resilient material and the nano-particles.

2. The electrical interconnect of claim 1 comprising a dielectric layer printed on the top surface of the substrate, the dielectric layer securing the first contact members to the substrate.

3. The electrical interconnect of claim 1 wherein the though holes comprise non-moldable features.

4. The electrical interconnect of claim 1 wherein the resilient material comprises an annular structure with a center opening adapted to receive the nano-particles.

5. The electrical interconnect of claim 1 wherein the first contact members comprise raised structures adapted to electrically couple with the contacts on the IC device.

6. The electrical interconnect of claim 1 wherein the first contact members comprise raised structures with a relief area adapted to collect contamination at a location offset from the electrical interface with the contacts on the IC device.

7. The electrical interconnect of claim 1 wherein at least the first contact members are adapted to move in at least the pitch and roll directions relative to the substrate.

8. The electrical interconnect of claim 1 wherein the substrate comprises at least one additional circuitry plane, the additional circuitry plane selected from one of a ground plane, a power plane, an electrical connection to other circuit members, a dielectric layer, or a flexible circuit.

9. The electrical interconnect of claim 1 comprising at least one printed electrical device located on the substrate and electrically coupled to at least a one of the contact members, wherein the electrical device is selected from one of shielding, near device decoupling, capacitors, transistors, resistors, filters, signal or power altering and enhancing devices, memory devices, embedded IC devices, RF antennae, and the like.

10. An electrical interconnect assembly comprising:
    a housing that retains the electrical interconnect of claim 1;
    an IC device located in the housing and electrically coupled with the first contact members; and
    a PCB soldered to the second contact members.

11. The electrical interconnect of claim 1 wherein the first contact members extend above the first surface.

12. A method of making an electrical interconnect to form an interconnect between contacts on an IC device and contact pads on a printed circuit board (PCB), the method comprising the steps of:
    forming a plurality of through holes from a first surface to a second surface of a substrate;
    imaging a resilient material in the through holes, the resilient material including openings extending from the first surface to the second surface;
    depositing a plurality of discrete, free-flowing conductive nano-particles in the openings of the resilient material, the conductive particles being substantially free of non-conductive materials;
    locating a plurality of first contact members at least partially in the through holes adjacent the first surface to electrically couple the nano-particles to the first contact members;
    locating a plurality of second contact members at least partially in the through holes adjacent the second surface to electrically couple the nano-particles to the second contact members; and
    pivoting at least the first contact members in the through holes relative to the substrate while the first contact members are supported by the resilient material and the nano-particles.

13. The method of claim 12 comprising printing a dielectric layer on the top surface of the substrate, the dielectric layer securing the first contact members to the substrate.

14. The method of claim 12 comprising forming the substrate as a multi-layered structure with non-moldable features.

15. The method of claim 12 comprising imaging the resilient material to form an annular structure with a center opening adapted to receive the nano-particles.

16. The method of claim 12 comprising forming a raised structure on the first contact members adapted to electrically couple with the contacts on the IC device.

17. The method of claim 12 comprising forming a raised structure on the first contact members including raised structures with a relief area adapted to collect contamination at a location offset from the electrical interface with the contacts on the IC device.

18. The method of claim 12 comprising moving at least the first contact members in at least the pitch and roll directions relative to the substrate.

19. The method of claim 12 comprising forming at least one additional circuitry plane in the substrate, the additional circuitry plane selected from one of a ground plane, a power plane, an electrical connection to other circuit members, a dielectric layer, or a flexible circuit.

20. The method of claim 12 comprising the steps of printing at least one electrical device on the substrate and electrically coupling the electrical device to at least a one of the contact members, wherein the electrical device is selected from one of shielding, near device decoupling, capacitors, transistors, resistors, filters, signal or power altering and enhancing devices, memory devices, embedded IC devices, RF antennae, and the like.

21. A method of claim 12 comprising the steps of:
    electrically coupling the contacts on the IC device with the first contact members; and
    biasing the IC device against the first contact members against the resistance of the resilient material.

* * * * *